(12) United States Patent
Yoshikawa et al.

(10) Patent No.: US 6,197,674 B1
(45) Date of Patent: Mar. 6, 2001

(54) CVD-TI FILM FORMING METHOD

(75) Inventors: Hideki Yoshikawa; Yasuo Kobayashi; Kunihiro Tada, all of Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/112,640

(22) Filed: Jul. 9, 1998

(30) Foreign Application Priority Data

Jul. 16, 1997 (JP) .................................................. 9-205475

(51) Int. Cl.[7] .................................................. H01L 21/44
(52) U.S. Cl. .................................................. 438/597
(58) Field of Search .................................... 438/648, 672, 438/675, 680, 683

(56) References Cited

U.S. PATENT DOCUMENTS 5,926,737 * 11/1999 Ameen et al. ..................... 438/649
5,975,912 * 11/1999 Hillman et al. ..................... 437/245

* cited by examiner

*Primary Examiner*—David Nelms
*Assistant Examiner*—Quoc Hoang
(74) *Attorney, Agent, or Firm*—Oblon, Spivak, McClelland, Maier & Neustadt, P.C.

(57) ABSTRACT

A method of forming a CVD-Ti film includes the steps of loading a Si wafer into a chamber, setting an interior of the chamber at a predetermined reduced-pressure atmosphere, introducing $TiCl_4$ gas, $H_2$ gas, and Ar gas into the chamber, and generating a plasma of the introduced gas in the chamber to form a Ti film in a hole formed in an $SiO_2$ film on the wafer. A wafer temperature is set to 400° to 800°, a supplied power is set to 100 W to 300 W, an internal chamber pressure is set to 0.5 Torr to 3.0 Torr, a flow rate ratio of $TiCl_4$ gas to a sum of $H_2$ gas and Ar gas is 1:100 to 1:300, and a flow rate ratio of $H_2$ gas to Ar gas is 1:1 to 2:1.

8 Claims, 5 Drawing Sheets

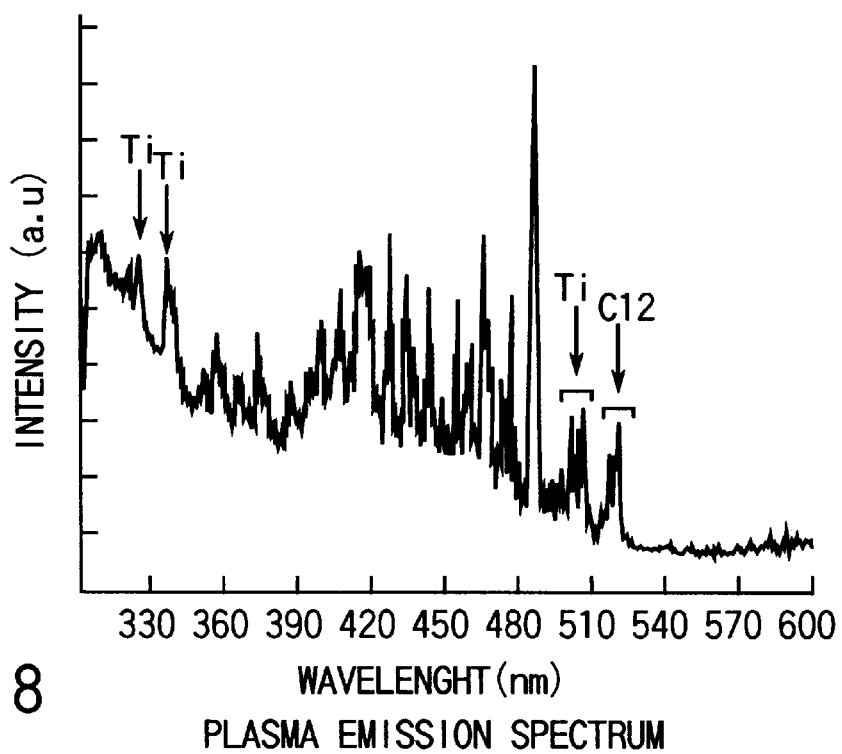
FIG. 8 WAVELENGHT (nm)
PLASMA EMISSION SPECTRUM
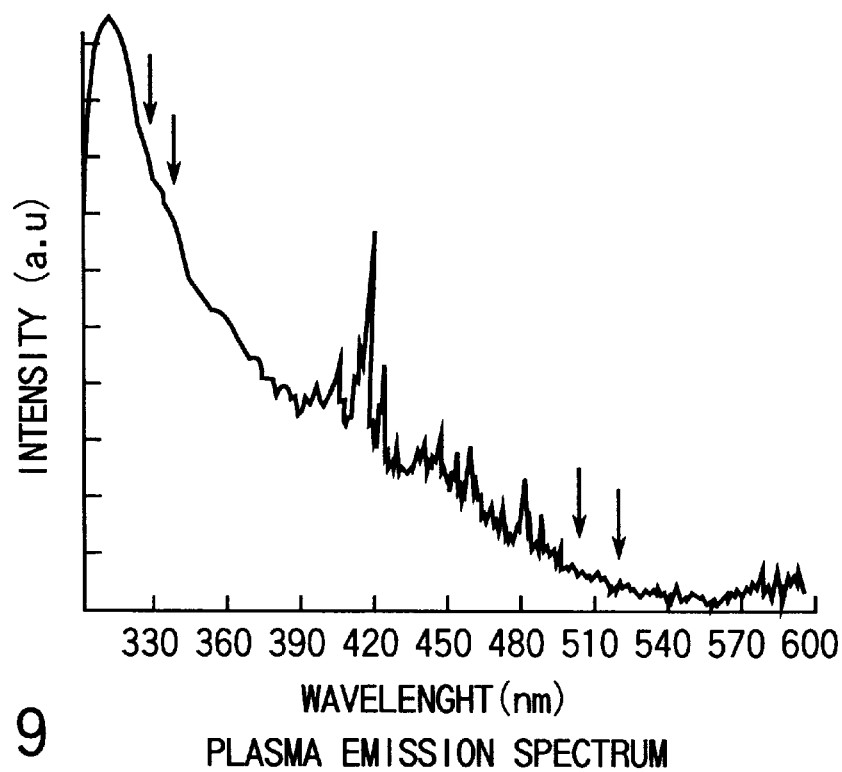
FIG. 9 WAVELENGHT (nm)
PLASMA EMISSION SPECTRUM

CVD-TI FILM FORMING METHOD

BACKGROUND OF THE INVENTION

The present invention relates to a method of forming a CVD-Ti film used as, e.g., a contact metal or adhesion, in a semiconductor device and, more particularly, to a CVD-Ti film forming method of forming a Ti film as a barrier layer in a hole of an insulating film which covers a silicon substrate and in which the hole is formed.

In the manufacture of a semiconductor device, to meet recent demands for higher density and higher integration degree, the circuit arrangement more often has a multilayer interconnection structure. In order to make electrical connection between a lower semiconductor device and an upper interconnection layer that are insulated from each other by an insulating film, e.g., an $SiO_2$ film, interposed between them, a technique that forms a buried portion in a hole, e.g., a contact hole or a via hole, formed in the insulating layer by CVD, thus achieving electrical connection between the upper and lower layers becomes significant.

In the above technique, to fill the contact hole or via hole, generally, Al (aluminum) or W (tungsten), or an alloy containing Al or W as a major component is used. When such a metal or alloy comes into direct contact with the lower Si (silicon) substrate or the Si layer, the metals may undesirably form an alloy in the boundary portion of the lower Si substrate or Si layer due to the absorbing effect of Si or the like. The alloy formed in this manner has a large electric resistance. Such alloying is not preferable in terms of power savings and higher operation speed that are recently demanded of the device.

When W or a W-alloy is used as a buried layer of a contact hole, $WF_6$ gas used in forming the buried layer enters the Si substrate to degrade the electrical characteristics and the like.

In order to prevent these inconveniences, before formation of a buried layer in a contact hole or via hole, a barrier layer is formed on the inner surface of the hole in advance, and then the buried layer is formed on the barrier layer. As this barrier layer, a layer formed by a Ti (Titanium) film or a two-laminated structure layer consisting of a Ti film and a TiN (titanium nitride) film is generally used.

This barrier layer is commonly formed by physical vapor deposition (PVD). As micropatterning and higher integration of the devices are particularly required recently and the design rule becomes particularly strict, the line width and the hole aperture diameter continue to decrease to result in an increase in aspect ratio. Along with this, the electrical resistance of the PVD film increases, making it difficult to meet the above demands.

For this reason, the Ti film and TiN film that construct the barrier layer are formed by chemical vapor deposition (CVD) which can form a higher-quality film. When forming the Ti film by CVD, $TiCl_4$ (titanium tetrachloride) and $H_2$ (hydrogen) are used as the reaction gases. When forming the TiN film, $TiCl_4$ and $NH_3$ (ammonia) or MMH (monomethyl hydrazine) are used as the reaction gases.

In recent years, semiconductor devices continue to shrink in feature size and the aspect ratio of a contact hole or via hole formed in an $SiO_x$ (e.g., $SiO_2$) film continues to increase. Therefore, with the conventional $TiCl_4$ and $H_2$ gas systems, it is difficult to form a CVD-Ti film in the hole portion with a good step coverage equal to or higher than 100%.

BRIEF SUMMARY OF THE INVENTION

It is an object of the present invention to provide a CVD-Ti film forming method that can form a Ti film in a small hole formed in an insulating film on an Si surface with a good step coverage.

It is another object of the present invention to provide a CVD-Ti forming method that can form a Ti film on both the inner surface of a hole in the insulating film and an Si surface portion exposed from the hole at a high film formation rate and a low temperature.

It is still another object of the present invention to provide a CVD-Ti film forming method that can cope with any one of applications that require a good step coverage and applications that require film formation on both an insulating film and the bottom surface of a hole at a high film formation rate and a low temperature.

In the present invention, when forming a CVD-Ti film in a hole of an insulating film formed on an Si surface of a substrate and having a hole or holes that expose part an parts of the Si surface, Ar gas is used in addition to conventional $TiCl_4$ gas and $H_2$ gas, and a plasma of these gases is generated. In plasma generation, Ar gas influences $TiCl_4$ gas serving as a film formation gas, differently from $H_2$ gas does. Accordingly, by utilizing the function of Ar gas, a Ti film of a desired state can be formed on the hole.

This will be explained with reference to FIG. 1. Referring to FIG. 1, reference numeral 10 denotes a shower head for introducing a gas into a chamber; and reference symbol W denotes an Si wafer. The right-side system indicates a reaction that takes place when Ar gas does not serve as a reaction gas, and the left-side system indicates a reaction that takes place when Ar gas serve as a reaction gas.

In the right-side system, H ions and/or H radicals decompose $TiCl_4$ into $TiCl_3+HCl$ and generate HCl after a TiSi film is formed on the wafer from $TiCl_3$ (a Ti film is formed on the oxide film). In the left-side system, Ar ions decompose $TiCl_4$ into $TiCl_2+Cl_2$ and $TiCl_2$ into $Ti+Cl_2$. Therefore, components that contribute to film formation increase due to the presence of Ar ions, so the film formation rate can be increased. When the ratio of Ar gas to $H_2$ gas, the ratio of these gases to $TiCl_4$ gas, the film formation temperature, the internal chamber pressure, and the power supplied when generating a plasma are adjusted, the film formation rate and the selectivity in film formation can be arbitrarily adjusted.

According to a first aspect of the present invention, these conditions are adjusted such that a Ti film is formed in the hole at high selectivity with respect to the insulating film. More specifically, the film formation rate of the Ti film on the Si surface exposed in the hole is increased sufficiently higher than the film formation rate of the Ti film on the insulating film and on the inner surface of the hole. This decreases the Ti film deposited on the hole entrance and sufficiently increases the Ti film deposited in the hole. In other words, the step coverage can be increased to be equal to or higher than 100%.

In this case, the selectivity can be increased if the following reaction is dominant:

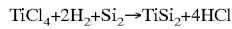

In order to effectively cause this reaction, it is preferable that, as in a second aspect, film formation be performed under such a condition that, when the state of the plasma is measured with plasma spectroscopy, the emission spectra of Ti and $Cl_2$ substantially do not exist.

Preferably, the substrate temperature is set to 400° C. to 800° C., the supplied power is set to 100 W to 300 W, and the internal chamber pressure is set to 0.5 Torr to 3.0 Torr, and more preferably the ratio of $TiCl_4$ gas to the sum of $H_2$ gas and Ar gas is set to 1:100 to 1:300 and the flow rate ratio of $H_2$ gas to Ar gas is set to 1:1 to 2:1. Then the reaction can be made dominant.

In a third aspect, the ratio of Ar gas to $H_2$ gas, the ratio of these gases to $TiCl_4$ gas, the film formation temperature, the internal chamber pressure, and the power supplied when generating a plasma are adjusted, so that a Ti film is formed on the exposed surface of the insulating film and on the Si surface portion in the hole at almost the same film formation rate. In this case, due to the presence of Ar gas, film formation can be done at a high film formation rate and a low temperature, which is suitable for a blanket process.

This film formation is possible if the following reaction is dominant in this case:

$$TiCl_4 + H_2 \rightarrow Ti + 2Cl_2 + H_2$$

or $$TiCl_4 + H_2 \rightarrow Ti + Cl_2 + 2HCl$$

Preferably, the substrate temperature is set to 350° C. to 550° C., the supplied power is set to 100 W to 800 W, the internal chamber pressure is set to 0.5 Torr to 3.0 Torr, the flow rate ratio of $TiCl_4$ gas to the sum of $H_2$ gas and Ar gas is set to 1:300 to 1:450, and the flow rate ratio of $H_2$ gas to Ar gas is set to 1:0.3 to 1:2. Then the reaction can be made dominant.

In a fourth aspect, Ar gas is introduced into the chamber in addition to $TiCl_4$ and $H_2$ gas, and the flow rate ratio of $TiCl_4$ gas to the sum of $H_2$ gas and Ar gas, the flow rate ratio of $H_2$ gas to Ar gas, the substrate temperature, the internal chamber pressure, and the power supplied when generating a plasma are adjusted, so that the selectivity of the Ti film is controlled. Hence, the same group of apparatus and the same group of gases can cope with both a process that requires a good step coverage and a blanket process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are sectional views of showing Si wafers to which the present invention is applied, in which FIG. 3A shows a case wherein a Ti film is formed on a device having a contact hole, and FIG. 3B shows a case wherein a Ti film is formed on a device having a via hole;

FIG. 8 is a graph showing the plasma emission spectrum where the emission spectra of Ti and $Cl_2$ substantially exist; and FIG. 9 is a graph showing the plasma emission spectrum where the emission spectra of Ti and $Cl_2$ substantially do not exist.

DETAILED DESCRIPTION OF THE INVENTION

The preferred embodiment of the present invention will be described in detail with reference to the accompanying drawings.

Figure 2:
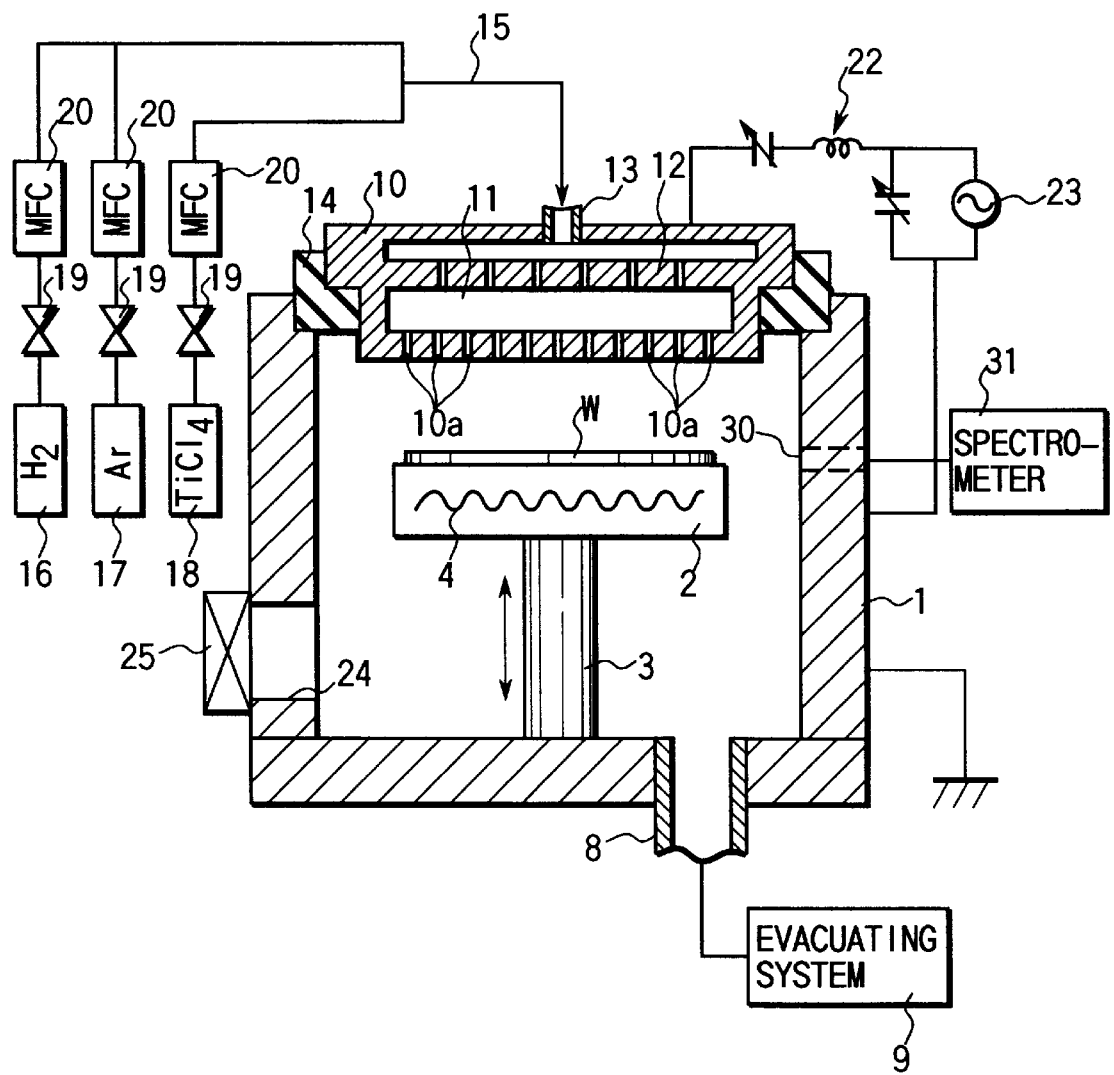
FIG. 2 is a sectional view schematically showing an example of a film formation apparatus used for practicing a CVD-Ti film forming method according to the present invention.

FIG. 2 is a sectional view showing an example of a Ti film formation apparatus used for practicing the present invention.

This film formation apparatus has a substantially cylindrical, air-tight chamber 1. A susceptor 2 for horizontally supporting an Si wafer W as an object to be processed is supported by a vertically movable cylindrical support member 3 at its center in the chamber 1, as indicated by a double-headed arrow. A heater 4 is buried in the susceptor 2. When a power is supplied to the heater 4 from a power supply (not shown), the heater 4 heats the Si wafer W as the object to be treated to a predetermined temperature through the susceptor 2.

In the upper end portion of the chamber 1, a shower head 10 is provided to face the semiconductor wafer W supported on the susceptor 2 through a predetermined distance. A large number of gas discharge holes 10a are formed in the lower wall of the shower head 10 that faces the wafer W. A space 11 is formed in the shower head 10, and a dispersion plate 12 formed with a large number of through holes is horizontally placed in the space 11. A gas inlet port 13 is formed in the upper portion of the shower head 10 to introduce a process gas into the shower head 10. The gas inlet port 13 is connected to a gas supply pipe 15.

The branch pipes of the gas supply pipe 15 are respectively connected to an $H_2$ gas source 16, an Ar gas source 17, and a $TiCl_4$ gas source 18. The respective gases are supplied from these gas sources into the chamber 1 through the gas supply pipe 15 and shower head 10 to form a Ti film on the Si wafer W. A valve 19 and a mass flow controller 20 are connected to each of the branch pipes connected to the respective gas sources.

The shower head 10 is connected to an RF power source 23 through a matching circuit 22. An RF power can be applied from the RF power source 23 into the chamber 1 through the shower head 10. With this RF power, a plasma of the film formation gas is generated in the chamber 1. The shower head 10 and the chamber 1 are electrically insulated from each other by an insulating member 14, and the chamber 1 is grounded.

An evacuating port 8 is arranged in the bottom wall of the chamber 1. The evacuating port 8 is connected to an evacuating system 9 that evacuates the interior of the chamber 1. A loading/unloading port 24 for the wafer W is formed in the lower portion of the side wall of the chamber 1. The loading/unloading port 24 can be opened/closed with a gate valve 25. Loading and unloading of the wafer W are performed after the susceptor 2 is moved downward.

Referring to FIG. 2, reference numeral 30 denotes a window formed in the side wall of the chamber 1 to oppose the plasma generating region (region between the wafer W and the shower head 10) in the chamber 1. A spectrometer 31 having an objective lens is arranged outside the window 30. As will be described later, the spectrometer 31 measures the state of the plasma to allow film formation under the condition where the emission spectra of Ti and $Cl_2$ substantially do not exist.

To form a Ti film with this film formation apparatus, the gate valve 25 is opened, and the Si wafer W is loaded in the chamber 1 and placed on the susceptor 2. While the Si wafer W is heated with the heater 4, the chamber 1 is evacuated by the vacuum pump of the evacuating system 9 to a high vacuum state. Subsequently, Ar gas, $H_2$ gas and $TiCl_4$ gas are introduced into the chamber 1 in this order, and an RF power is applied by the RF power source 23 to generate a plasma.

Figure 1:
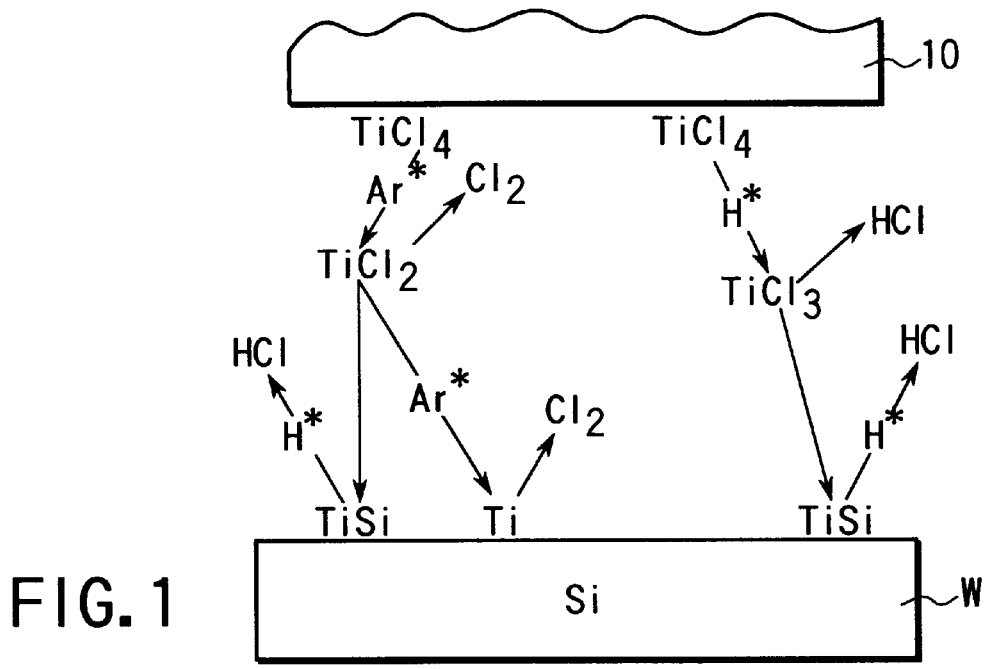
FIG. 1 is a diagram showing the reaction of gases used in the present invention in a plasma.
Figure 3A:
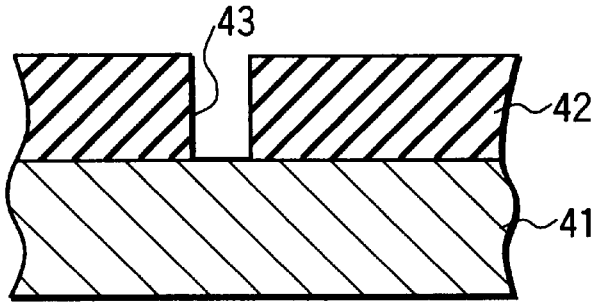
Figure 3B:
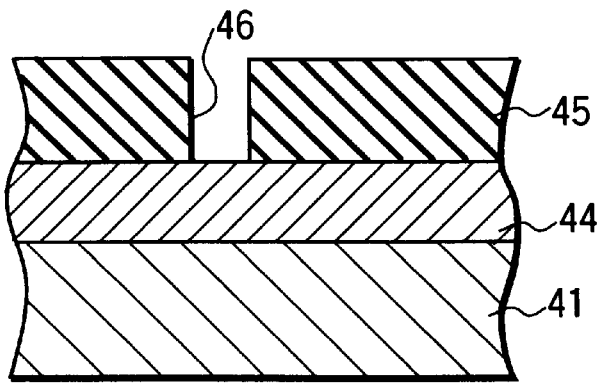

As the object on which a Ti film is to be formed, for example, as shown in FIG. 3A, a structure obtained by forming an $SiO_2$ film 42 as an insulating film on an Si substrate (wafer) 41 and forming a contact hole 43 in the $SiO_2$ film 42, or as shown in FIG. 3B, a structure obtained by forming an $SiO_2$ film 45 as an insulating interlayer film on a poly-Si film 44 formed on an Si substrate 41 and forming a via hole 46 in the $SiO_2$ film 45, is used.

When a Ti film need to be formed on the bottom portion of such a contact hole 43 or via hole 46 with a good step coverage equal to or higher than 100%, film formation is done under such a condition that the selectivity of Ti film formation on Si is higher than that on $SiO_2$. More specifically, the film formation rate of the Ti film on Si in the hole (on the surface of a hole exposed by the hole in the Si wafer or poly-Si film, or bottom surface) is increased to be sufficiently higher than that on the $SiO_2$ film (the upper surface of the $SiO_2$ film and the peripheral surface of the hole). This decreases the Ti film deposited on the entrance of the hole and allows a Ti film to be formed in the hole with a step coverage equal to or higher than 100%.

In this case, the selectivity can be increased if the following reaction is dominant:

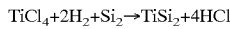

In order to effectively cause this reaction, film formation may be performed under such a condition that, when the state of the plasma is measured with plasma spectroscopy, the emission spectra of Ti and $Cl_2$ substantially do not exist. More specifically, film formation must be performed such that a spectrum exhibiting the presence of Ti (peak value: near 330 nm and near 500 nm) or $Cl_2$ (peak value: near 520 nm), as shown in FIG. 8 does not appear in the emission spectrum of the plasma, as shown in FIG. 9.

As the condition employed in this case, it is preferable that the substrate temperature be set to 400° to 800°, more preferably 550° C. to 700° C., the power supplied to the RF power supply be set to 100 W to 300 W, the internal chamber pressure be set to 0.5 Torr to 3.0 Torr, the ratio of $TiCl_4$ gas to the sum of $H_2$ gas and Ar gas be set to 1:100 to 1:300, and the flow rate ratio of $H_2$ gas to Ar gas be set to 1:1 to 2:1. Practical gas flow rates are preferably 500 sccm to 2,000 sccm for $H_2$ gas, 500 sccm to 1,000 sccm for Ar gas, and 10 sccm for $TiCl_4$ gas.

Figure 4:
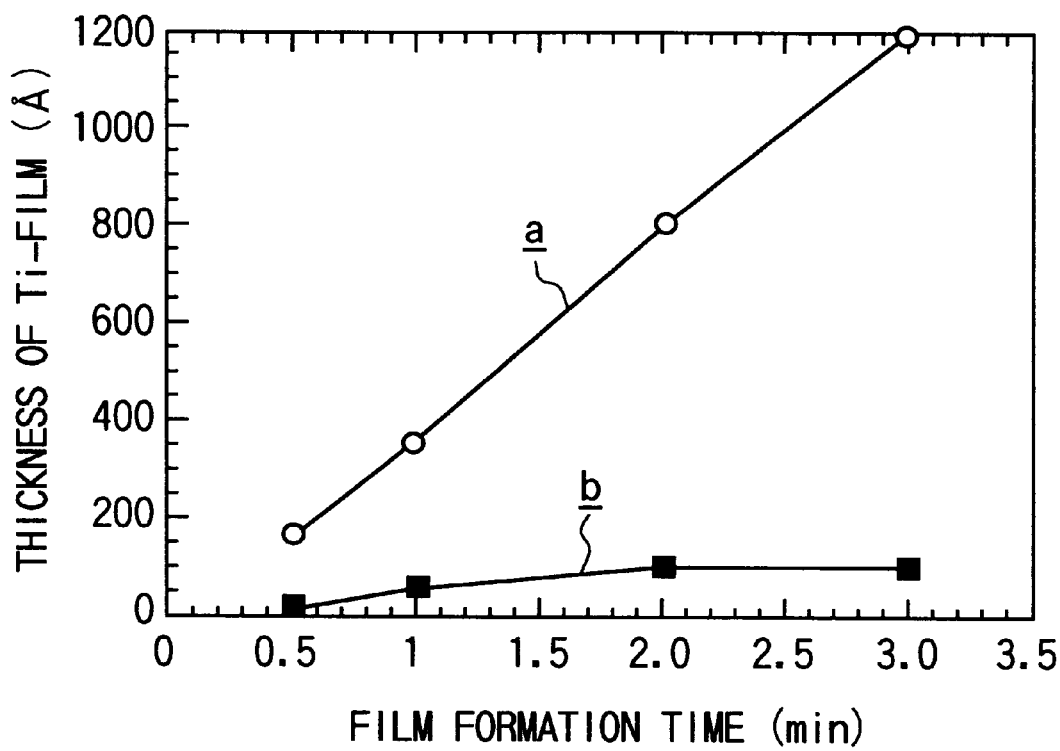
FIG. 4 is a graph showing the relationship between the film formation time and film thickness of a Ti film in a high-selectivity process, comparing a case wherein a Ti film is formed on Si and a case wherein a Ti film is formed on $SiO_2$.
Figure 5:
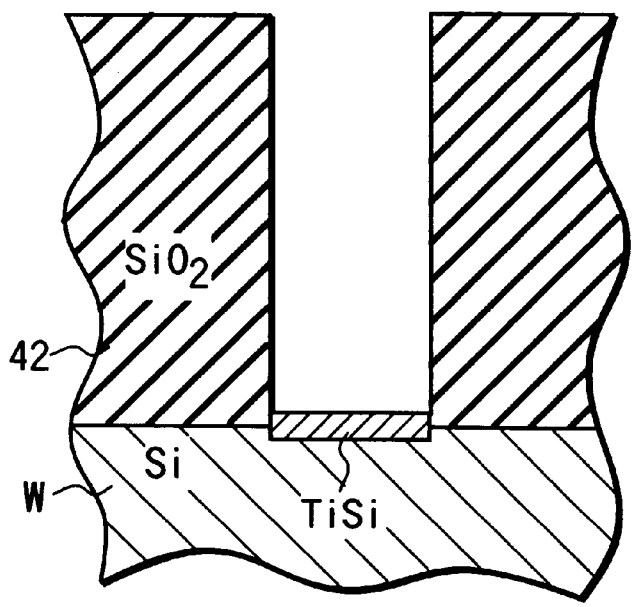
FIG. 5 is a diagram showing the state of the Ti film formed by the high-selectivity process.

As an example, a Ti film was formed with a wafer temperature of 580° C., an internal chamber pressure of 1.0 Torr, a power of 200 W supplied to the RF power supply (13.56 MHz), an $H_2$ gas flow rate of 1,000 sccm, an Ar gas flow rate of 1,000 sccm, and a $TiCl_4$ gas flow rate of 10 sccm. Film formation with high selectivity as shown in FIG. 4 could be performed. Referring to FIG. 4, the ordinate represents the thickness of the Ti film, and the abscissa represents the film formation time. A curve a represents film formation on Si and a curve b represents film formation on $SiO_2$. FIG. 5 is an illustration drawn on the basis of an SEM picture showing the film formation state when the film formation time is 3 minutes. As is understood from FIG. 5, hardly any Ti film is formed on the $SiO_2$ film 42, and a Ti film or TiSi film having a predetermined thickness (about 1,200 Å) is formed on only the Si wafer W. As shown in this picture, a Ti film is formed in the hole with a good step coverage.

When a Ti film must be formed on the surface of the $SiO_2$ film and on Si (exposed surface of the Si wafer) in the hole at nearly the same film formation rate, it can be achieved by adjusting the above condition.

In this case, due to the presence of Ar gas, film formation can be done at a high film formation rate and a low temperature, which is suitable for a blanket process. This film formation is possible if the following reaction is dominant:

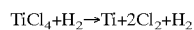

or

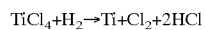

As the condition for this case, it is preferable that the wafer temperature be set to 350° C. to 550° C., the supplied power be set to 100 W to 800 W, the internal chamber pressure be set to 0.5 Torr to 3.0 Torr, the flow rate ratio of $TiCl_4$ gas to the sum of $H_2$ gas and Ar gas be set to 1:300 to 1:450, and the flow rate ratio of $H_2$ gas to Ar gas be set to 1:0.3 to 1:2. Practical gas flow rates are preferably 1,000 sccm to 3,500 sccm for $H_2$ gas, 1,000 sccm to 2,000 sccm for Ar gas, and 10 sccm for $TiCl_4$ gas.

Figure 6:
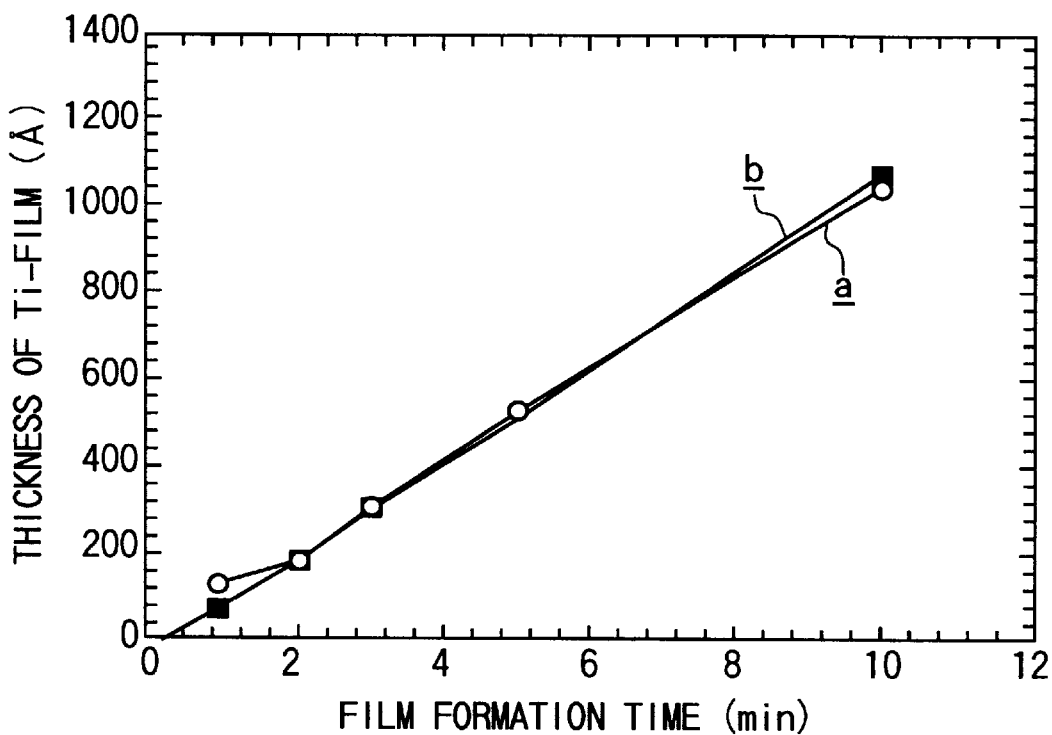
FIG. 6 is a graph showing the relationship between the film formation time and film thickness of a Ti film in a blanket process, comparing a case wherein a Ti film is formed on Si and a case wherein a Ti film is formed on $SiO_2$.
Figure 7:
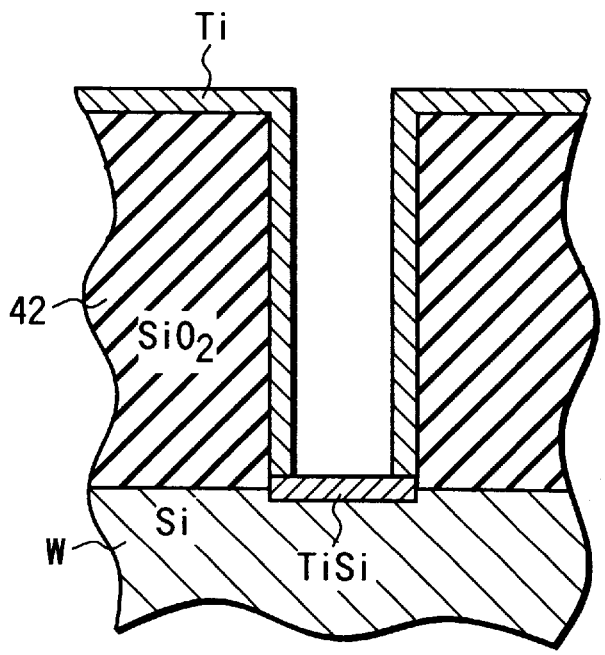
FIG. 7 is a diagram showing the state of the Ti film formed by the blanket process.

As an example, a Ti film was formed with a wafer temperature of 550° C., an internal chamber pressure of 1.0 Torr, a power of 500 W supplied to the RF power supply (13.56 MHz), an $H_2$ gas flow rate of 2,000 sccm, an Ar gas flow rate of 1,000 sccm, and a $TiCl_4$ gas flow rate of 10 sccm. As shown in FIG. 6, film formation progressed at nearly the same film formation rate on the $SiO_2$ film and in the hole. Referring to FIG. 6, the ordinate represents the thickness of the Ti film, and the abscissa represents the film formation time. A curve a represents film formation on Si and a curve b represents film formation on $SiO_2$. FIG. 7 is an illustration drawn on the basis of an SEM picture showing the film formation state when the film formation time is 3 minutes. As shown in FIG. 7, Ti films having approximately the same thicknesses are formed on the $SiO_2$ film 42, the peripheral surface of the hole, and the bottom portion of the hole (the bottom portion, i.e., the film on Si can be regarded as a TiSi film).

Ar gas is introduced into the chamber 1 in addition to $TiCl_4$ and $H_2$ gas, the flow rate ratio of $TiCl_4$ gas to the sum of $H_2$ gas and Ar gas, the flow rate ratio of $H_2$ gas to Ar gas, the wafer temperature, the internal chamber pressure, and the power supplied to the RF power supply are adjusted as described above, so that the selectivity of the Ti film is controlled. Consequently, the same apparatus and the same group of gases can cope with both a process that requires a good step coverage, and a blanket process.

After the Ti film is formed in this manner, $TiCl_4$ gas, Ar gas, $NH_3$ gas, and MMH gas are introduced to form a TiN film on the Ti film, thus providing a barrier layer having a two-layered structure. After that, an interconnection metal film, e.g., an Al film, is formed.

The present invention is not limited to the above embodiment, but various changes and modifications may be made.

For example, although $TiCl_4$ gas, $H_2$ gas, and Ar gas are used in the above embodiment, other gases may be included. Concerning the manufacturing condition, it is not limited to the condition described above, but may be arbitrarily set so that a desired Ti film is formed.

As has been described above, according to the present invention, when forming a CVD-Ti film on an insulating film, e.g., an $SiO_x$ film having a hole and formed on an Si substrate or an Si film on the Si substrate (called a substrate having an Si surface), Ar gas is used in addition to conventional $TiCl_4$ gas and $H_2$ gas, and a Ti film is formed by generating a plasma of these gases. Therefore, components that contribute to film formation increase due to the presence of Ar ions, so that the film formation rate can be increased. Since the ratio of Ar gas to $H_2$ gas, the ratio of Ar gas to $TiCl_4$ gas and the ratio of $H_2$ gas to $TiCl_4$ gas, the film formation temperature, the internal chamber pressure, and the power supplied when generating a plasma are adjusted, the film formation rate and the selectivity in film formation can be adjusted. As a result, a Ti film can be formed in the hole portion at high selectivity with respect to the insulating film, and Ti films can be formed on the insulating film and on Si in the hole portion at nearly the same film formation rates.

Although the $SiO_x$ film is employed as the insulating film in the above embodiment, another insulating film, e.g., an $Si_3N_4$ film containing Si, may be used. The Si surface of the substrate is not limited to single-crystal Si or poly-Si, but can be amorphous Si or a combination of single-crystal Si, poly-Si and amorphous Si.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a CVD-Ti film in a hole of an insulating film formed on an Si surface of a substrate, the hole exposing part of the Si surface, said method comprising the steps of:

loading the substrate into a chamber;

setting an interior of said chamber at a predetermined reduced-pressure atmosphere;

introducing a process including $TiCl_4$ gas, $H_2$ gas, and Ar gas into said chamber; and generating a plasma of the process gas in said chamber to form a Ti film in the hole; and forming the Ti film in the hole at high selectivity with respect to the insulating film by adjusting flow rates of the gases, a substrate temperature to 400° to 800°, an internal chamber pressure to 0.5 Torr to 3.0 Torr, and a power supplied when generating the plasma to 100 W to 300 W, wherein a flow rate ratio of $TiCl_4$ gas to a sum of $H_2$ gas and Ar gas is adjusted to 1:100 to 1:300 and a flow rate ratio of $H_2$ gas to Ar gas is adjusted to 1:1 to 2:1.

2. A method according to claim 1, wherein the step of film formation is performed under such a condition that, when a state of the plasma is measured with plasma spectroscopy, emission spectra of Ti and $Cl_2$ substantially do not exist.

3. A method according to claim 1, wherein the insulating film is an $SiO_2$ film or an $Si_3N_4$ film.

4. A method according to claim 1, wherein the substrate is an Si wafer or a poly-Si layer.

5. A method of forming a CVD-Ti film in a hole of an insulating film formed on an Si surface of a substrate the hole exposing part of the Si surface, said method comprising the steps of:

loading the substrate into a chamber;

setting an interior of said chamber at a predetermined reduced-pressure atmosphere;

introducing $TiCl_4$ gas, $H_2$ gas, and Ar gas into said chamber; and generating a plasma of the introduced gases in said chamber to form a Ti film in the hole; and forming the Ti film in the hole on an inner surface of the hole and on part of the Si surface exposed by the hole at substantially identical film formation rates by adjusting flow rates of the gases, a substrate temperature to 350° to 500°, an internal chamber pressure to 0.5 Torr to 3.0 Torr, and a power supplied when generating the plasma to 100 W to 800 W, wherein a flow rate ratio of $TiCl_4$ gas to a sum of $H_2$ gas and Ar gas is adjusted to 1:300 to 1:450 and a flow rate ratio of $H_2$ gas to Ar gas is adjusted to 1:0.3 to 1:2.

6. A method according to claim 5, wherein the step of film formation is performed under such a condition that, when a state of the plasma is measured with plasma spectroscopy, emission spectra of Ti and $Cl_2$ substantially do not exist.

7. A method according to claim 5, wherein the part of the Si surface exposed by the hole is a poly-Si surface.

8. A method of forming a CVD-Ti film in a hole of an insulating film formed on an Si surface of a substrate, the hole exposing part of the Si surface, said method comprising the steps of:

loading the substrate into a chamber;

setting an interior of said chamber at a predetermined reduced-pressure atmosphere;

introducing $TiCl_4$ gas, $H_2$ gas, and Ar gas into said chamber;

generating a plasma of the introduced gas in said chamber to form a Ti film in the hole; and controlling selectivity of the Ti film in order that, when a state of the plasma is measured with plasma spectroscopy, emission spectra of Ti and $Cl_2$ substantially do not exist by adjusting a flow rate ratio of $TiCl_4$ gas to a sum of $H_2$ gas and Ar gas, a flow rate ratio of $H_2$ gas to Ar gas, a substrate temperature, an internal chamber pressure, and a power supplied when generating the plasma.

* * * * *